(12) United States Patent
Marean et al.

(10) Patent No.: US 10,831,940 B2
(45) Date of Patent: Nov. 10, 2020

(54) UTILITY SITUATIONAL AWARENESS SYSTEM

(71) Applicant: GAS TECHNOLOGY INSTITUTE, Des Plaines, IL (US)

(72) Inventors: James Marean, Binghamton, NY (US); William Gale, Palm Coast, FL (US)

(73) Assignee: GAS TECHNOLOGY INSTITUTE, Des Plaines, IL (US)

( * ) Notice: Subject to any disclaimer, the term of this patent is extended or adjusted under 35 U.S.C. 154(b) by 993 days.

(21) Appl. No.: 15/388,314

(22) Filed: Dec. 22, 2016

(65) Prior Publication Data

US 2017/0185698 A1 Jun. 29, 2017

Related U.S. Application Data

(60) Provisional application No. 62/387,268, filed on Dec. 23, 2015.

(51) Int. Cl.
*G06F 30/13* (2020.01)
*G06Q 10/06* (2012.01)
*G06Q 50/06* (2012.01)

(52) U.S. Cl.
CPC .......... *G06F 30/13* (2020.01); *G06Q 10/0637* (2013.01); *G06Q 50/06* (2013.01)

(58) Field of Classification Search
CPC ..... G06F 17/5004; G06F 30/13; G06Q 50/06; G06Q 10/0637
See application file for complete search history.

(56) References Cited

U.S. PATENT DOCUMENTS

| 9,297,723 | B1* | 3/2016 | Hofmann | G01M 99/00 |
| 2004/0236620 | A1* | 11/2004 | Chauhan | G06Q 10/06 705/7.14 |
| 2008/0062167 | A1* | 3/2008 | Boggs | G06F 17/5004 345/419 |
| 2012/0203388 | A1* | 8/2012 | DiLuciano | G06Q 10/04 700/292 |
| 2014/0081998 | A1* | 3/2014 | Fan | G06F 16/29 707/754 |

(Continued)

OTHER PUBLICATIONS

"IEC 60870-6," Jul. 22, 2015, Wayback Machine https://en.wikipedia.org/wiki/IEC_60870-6, 5 pages (Year: 2015).*

(Continued)

*Primary Examiner* — Kamini S Shah
*Assistant Examiner* — Russ Guill
(74) *Attorney, Agent, or Firm* — Pauley Erickson & Swanson (57) ABSTRACT

A method and software-implemented system that provides a situational awareness tool for infrastructure operators and government agencies to assess vulnerabilities, and optimize the deployment of prevention and mitigation technologies. The invention automatically obtains current supply information from each of more than one participating utility provider. The supply information from the different sources is standardized and combined with geographic information to provide a building level map of utility service and outages. The service locations, e.g., residential and commercial buildings, are represented as building polygons corresponding to building footprint, and can be color-coded to indicate service status.

19 Claims, 3 Drawing Sheets

(56) References Cited

U.S. PATENT DOCUMENTS

| | | | | |
|---|---|---|---|---|
| 2014/0129272 | A1* | 5/2014 | Hanley | G06Q 10/06311 705/7.13 |
| 2014/0181189 | A1* | 6/2014 | Brobst | G08G 1/168 709/203 |
| 2014/0257913 | A1* | 9/2014 | Ball | G06Q 10/04 705/7.25 |
| 2015/0100166 | A1* | 4/2015 | Baynes | H04L 12/2825 700/278 |
| 2015/0134135 | A1* | 5/2015 | Wong | H02J 3/38 700/295 |
| 2015/0213035 | A1* | 7/2015 | Collins | G06F 16/22 707/711 |
| 2016/0343093 | A1* | 11/2016 | Riland | G06Q 10/04 |
| 2017/0032436 | A1* | 2/2017 | DiSalvo | G06Q 30/0613 |

OTHER PUBLICATIONS

"Problems faced by the organization that led to the initiation of this project," Oct. 20, 2014, https://www.slideshare.net/npurey/gift-city-command-and-control-center-concept-andimplementationchallanges-solutions-40476535, 18 pages (Year: 2014).*

"GIFT—A Smart City," 2014, esri India,32 pages (Year: 2014).*

Sandeep Pathak, "Smart Utilities and the ArcFM Solution," Dec. 11, 2014, Schneider Electric, 37 pages (Year: 2014).*

Jim Horstman, "Outage Data Initiative," 2014, CIM User Group, 21 pages (Year: 2014).*

G. Anthony R. Beck et al., "Seeing the unseen: delivering integrated underground utility data in the UK," 2009, GeoWeb 2009 Conference, 8 pages (Year: 2009).* https://www.fema.gov/hazus-mh-overview,"FEMA Hazus Overview," last updated Apr. 10, 2017, 18 pages.

Rasplot, "Flood Insurance Study Profile Plot Program User's Guide,"Federal Emergency Management Agency, Mar. 2005, 47 pages.

https://www.fema.gov/quick-2-tutorial-system-requirements,"FEMA Quick-2 Tutorial System Requirements," last updated Jun. 2, 2015, 5 pages.

http://www.hyper-reach.com/,"Hyper-Reach a Power of Instant Communication," Jun. 2017, 3 pages.

"AtHoc Networked Crisis Communication,"BlackBerry, Jan. 2017, 7 pages.

https://www.emnet.net/approach,"Glass Box: An open-source, open-architecture, collaborative design process with our clients,"Emnet Real Time Sewer Tech. Services, Jun. 2018, 2 pages.

http://preparedness.intermedix.com/solutions/webeoc, The New WebEOC, Incident Management, Intermedix, Jun. 2017, 7 pages.

http://www.adashisystems.com/adashi-mdt/,"A Better Way to View Responding Units & ETA,"Adashi, Jun. 2017, 3 pages.

Tech Notes,"Next-Generation incident Command System,"Lincoln Laboratory, Massachusetts Institute of Tech., 2011, 2 pages. (well before filing, no month needed).

* cited by examiner

Prior Art

Fig. 4

UTILITY SITUATIONAL AWARENESS SYSTEM

CROSS REFERENCE TO RELATED APPLICATION

This application claims the benefit of U.S. Provisional Patent Application, Ser. No. 62/387,268, filed on 23 Dec. 2015. The Provisional Application is hereby incorporated by reference herein in its entirety and is made a part hereof, including but not limited to those portions which specifically appear hereinafter.

GOVERNMENT RIGHTS

This invention was made with government support under grant D14PC00213 awarded by the U.S. Department of Homeland Security. The government has certain rights in the invention.

BACKGROUND OF THE INVENTION

Field of the Invention

This invention relates generally to a method and software/hardware implemented system that provides a continuous awareness of emerging and imminent threats to utility infrastructures, and more particularly to a situational awareness tool for infrastructure operators and government agencies to assess vulnerabilities, and optimize the deployment of prevention and mitigation technologies.

Discussion of Related Art

Utility infrastructures, such as electricity, water, and natural gas, are complex and vulnerable to various threats including floods, wind damage, seismic activity, and soil erosion. In 2005, Hurricanes Katrina and Rita not only damaged offshore oil and gas platforms, but also onshore pipelines and utility distribution lines. In 2008, Hurricanes Gustav and Ike caused flooding and damage that resulted in the shutdown of pipeline systems, resulting in temporary shortages to East Coast markets. In 2011, unprecedented natural gas outages left over 50,000 people in Texas and New Mexico without heat for over a week with below freezing temperatures. The outages were due to production declines resulting from equipment freeze-offs, icy roads that prevented restoration activities, and rolling electric black-outs that shut-down equipment and facilities.

Critical infrastructure operators, such as electricity and/or natural gas utility companies, are generally not allowed by law or regulation to share system level information for security and interoperability reasons. Utility companies increase their vulnerability to physical and cyber-attacks by sharing system level information that identifies, for example, the location and engineering parameters of infrastructure control facilities such as regulators, control valves, and gate stations.

Current commercially available disaster management tools can be categorized into three sections: Disaster Analytic Tools, Alert. Products, and Incident Command Management. Disaster Analytic Tools include RASPLOT and Quick-2, which are products designed specifically to develop data sets to be used for flood risk management. RASPLOT is used to create flood profiles used in the flood insurance study reports and flood insurance rate maps. Quick-2 is a software product that develops flood elevations, (normal depth, critical depth, and back water analysis. HAZUS-MH (Hazards U.S. Multi-Hazard) is a further product in the disaster analytic tool category. Unlike RASPLOT and Quick-2, which process flood data for the development of maps for the National Flood Insurance Program (NFIP), HAZUS-MH is used to perform analysis to estimate losses resulting from earthquakes, hurricane winds and floods. HAZUS-MH is designed to estimate risk and is used by members of the federal, state and city governments for a particular event (flood, Hurricanes, earthquake). HAZUS is used for preplanning readiness in the case of floods and hurricanes. Preplanning activities can also be checked in the general sense for certain types of earthquake conditions.

Public Alert and Warning System (IPAWS) products represent systems designed to provide alert capabilities for a variety of conditions.

Incident. Command Management products, available from Intermedix Corp. (WebEOC), Adashi (Command Post) and FieldSoft (AIMSonScene) and Storm Petrel, LLC (Tempest-GEMS and Tempest-Time), are used in specialty areas of emergency management, such as law enforcement, fire management, crowd management, etc. The products generally support disaster management using incident command principals but do not have specific interfaces to support the predictive capabilities for understanding, for example, damage to the utilities such as the electric or natural gas infrastructure, damage assessment, and reporting a restoration processes that directly support utility operations.

While there are many disaster management systems, they lack interconnectivity and the ability to share outage information due to laws and regulations. There is a continuing need for improved monitoring of and emergency response to utilities such as electrical, telecommunication, and natural gas supply infrastructures.

SUMMARY OF THE INVENTION

The invention includes a utility situational awareness system, referred to herein as USAS, and corresponding implementation method, that creates data exchange methodologies for critical utility infrastructure operators and government agencies to share information, provide situational awareness, and assist with decision support during outages and disasters. These capabilities will provide utility companies and organizations that rely on service, with the ability to assess threats and vulnerabilities, understand interdependencies and their cascading effects, and hasten recovery. The system and method of this invention can collect, collate, and publish status information from critical infrastructure operators through map-based services and report on the status of service during a disaster.

The invention includes a method of providing situational awareness of utility infrastructures operated by more than one utility provider. Embodiments of the method include: automatically obtaining supply information from each of more than one utility provider and also geographic information; automatically standardizing the geographic information and supply information at a building level; automatically combining the information into a standardized building level display; and automatically providing, such as to a processing device of remote outage responding entities, updates on infrastructure and restoration status from the utility providers through, and on, the building level display. The standardized building level display is desirably presented as a building level map that represents buildings supplied by the utility providers as geospatial elements, such as polygons, and the infrastructure and restoration status uses a coding, such as a color coding, for each geospatial element to indicate current utility delivery status at the corresponding building.

The invention automatically extracts and integrates non-confidential information from each of different proprietary formats between outage management systems of the more than one utility provider. By providing, for example, an application program interface (API) to each utility provider, the utility providers can build a corresponding software module executable on their respective systems to provide the building level information used by this invention to construct and update the building level display.

The invention further includes a system for providing situational awareness of utility infrastructures operated by more than one utility provider. The system uses one or more data processors in executable combination with one or more memory devices and/or databases. The one or more memory devices includes coded instructions for implementing a decision support component that automatically obtains utility supply information over a network from each of the more than one remote utility provider, and along with geographic information, automatically standardizes the utility supply information at a building, level, and automatically combines the geographic information and supply information into a standardized building level display. An information sharing component automatically provides to at least one remote outage responding entity updates on infrastructure and restoration status from the more than one utility provider on the building level display, such as a building level map with coded, polygonal representations of buildings forwarded to remote computer systems and/or mobile devices of responders and/or repair crews. A situational awareness module can be used to import geographic data from external sources for predicting and/or characterizing disaster damage. The decision support component receives status updates and provides real-time updates to the standardized building level display, and the information sharing component transmits the real-time updates.

Critical infrastructure operators, including electricity and/or natural gas utility companies, cannot share system level information for security and interoperability reasons. Utility companies increase their vulnerability to physical and cyber-attacks by sharing system level information that identifies the location and engineering parameters of infrastructure control facilities such as regulators, control valves, and gate stations. In embodiments of this invention, infrastructure operators share general service and restoration data at the customer location level without disclosing operating characteristics, physical construction and topology of their distribution networks. Natural gas and electric utility companies share customer/location status information, and system level engineering information is not provided. With this information all emergency responders can work cooperatively during an emergency understanding the state of the utilities provided to a particular dwelling, facility, township, city or county. The very metrics that are so difficult to obtain during an emergency are the very information that is shared graphically across all emergency responders by this invention. The method and system of this invention determines and reports system status building by building, enabling geospatial definitions of an emergency, defined by non-detailed representation "building polygons". This approach, used in combination with advanced geospatial processing technologies and data exchange methodologies, enables utility companies and other critical infrastructure operators to exchange data for information sharing and decision support. This approach avoids the security and proprietary risks typically associated with network level information sharing. The invention can collate and reverse engineer the data from, without limitation, utility company's outage management systems, telemetry, and external sources such as sensors and social media to create situational awareness.

The USAS of embodiments of this invention reduce the time required to collect data and publish reports from several hours using current methods to several minutes using automated geospatial processing techniques and standardized data exchange methodologies. Beneficial impacts include:

Increasing situational awareness during disasters to support decision making related to threat identification, preparation, and restoration prioritization and scheduling to prevent or reduce outages by up to 10%;

Increasing the quality and integrity of the exchanged data through automation by reducing the opportunity for human error (95% accuracy); and/or Reducing the amount of time required for critical infrastructure operators to exchange essential system status data (5-10 minutes).

A primary end-user of the USAS system and method of this invention will be, without limitation, critical infrastructure operators (utility companies). USAS can be used by utility companies, emergency responders, and government agencies to share information. These groups can also obtain situational awareness of the service and restoration status of delivery systems and the infrastructure necessary for the restoration of service during and after a disaster. Utility companies can use the system to predict outages and cascading effects, such as using historical data as a comparison. They can then make decisions regarding resource staging prior to an event, make safe operations for public safety, notify impacted customers, and deploy restoration crews. Electric utility companies and other end-users of natural gas can, for example, use USAS to obtain real-time information on natural gas service and restoration status to make operational decisions. First responders can use the system to obtain damage assessment information defined at specific utility locations to insure public and worker safety. Government and regulatory agencies can use USAS to gain an understanding of service and restoration status for resource allocation and reporting to the public and other government agencies.

USAS provides a mechanism to share information about the status of critical utility delivery service during a disaster to support situational awareness and decision making to reduce the occurrence and impact of outages.

DETAILED DESCRIPTION

This invention provides a situational awareness system and method for utility infrastructures that does not require knowledge of the topological relationships of the equipment found in any energy distribution network. The utility situational awareness system (USAS) and method of this invention uses unique modeling techniques that integrate various publicly available geospatial features (roads, waterways, weather, stream gauges, seismic events, and/or others) to define the impact area with a modeled overlay representation of the buildings. With the cooperation of the service providers in a disaster area, USAS can represent the various states of utility service and provide a platform for freely exchanging the status of utility services without revealing the physical details of the utility/energy delivery infrastructure or its control points.

The method and system of this invention automatically obtains supply information from each of more than one participating utility provider. The supply information is desirably real-time, but can be provided at predetermined timeframes, depending on need. The supply information is standardized, such as before or after receipt, and then combined with geographic based weather information to provide a building level map of impacted utility services and probable or confirmed outages.

Service points, such as each individual building or other structure, are represented on the building level map as geospatial representations, such as a polygon of or approximating the building footprint. Representing buildings as building polygons provides a way for each utility system (e.g., electric, gas, telecommunications, etc.) to express the state of service at each delivery point during an event. The system can then automatically aggregate these results at various detailed levels defining a comprehensive picture of the impact area and the state of the utilities within the impact area during a disaster for a wide variety of audiences. A strength of this invention is its ability to provide a mechanism that allows all participants in a disaster recovery process to understand the progress made during a disaster response.

Current systems are designed to manage and report outages on exact models of the distribution networks. Electric outage systems examine call information and relate the calls to transformers, feeders, and substations. Telecommunications outage reporting systems perform similar analytical processes all related to the network definition of the telecommunications system. Likewise, outage management solutions and outage reporting systems for gas can relate service interruption through the topological relationships of meters, services, mains, regulators stations, and city gate stations. Most of the systems are designed solely to assist utility operations in system reconfiguration and crew dispatch for Faster restoration.

The current commercial solutions modeling the outage conditions are dependent upon a network representation of the distribution system, few utilities can or will electronically share their information with other utilities or emergency management officials. The barriers to sharing outage data exist because of security concerns and very different types of network data. Because of these barriers to sharing, emergency management officials and other utilities are left with high-level paper reports generated by each utility provider. The reports that are available are inadequate when trying to assess the state of all of the utility systems capability during a disaster.

In embodiments of this invention, the method and system are designed to be used during a disaster that involves more than one responding organization, thereby providing improved awareness, information sharing, and decision support. The system can integrate with and coordinate the exchange of data with an organization's geographic information system and/or outage management system; however, it may not provide either capability. In embodiments of this invention, the system has real-time access to publically available data, from a variety of sources, supported by national organizations (US Geologic Survey, National Weather Services, etc.). This data as well as the linkage to it is maintained and updated as information and linkages change and new sources become available for the system to remain useful.

Figure 1:
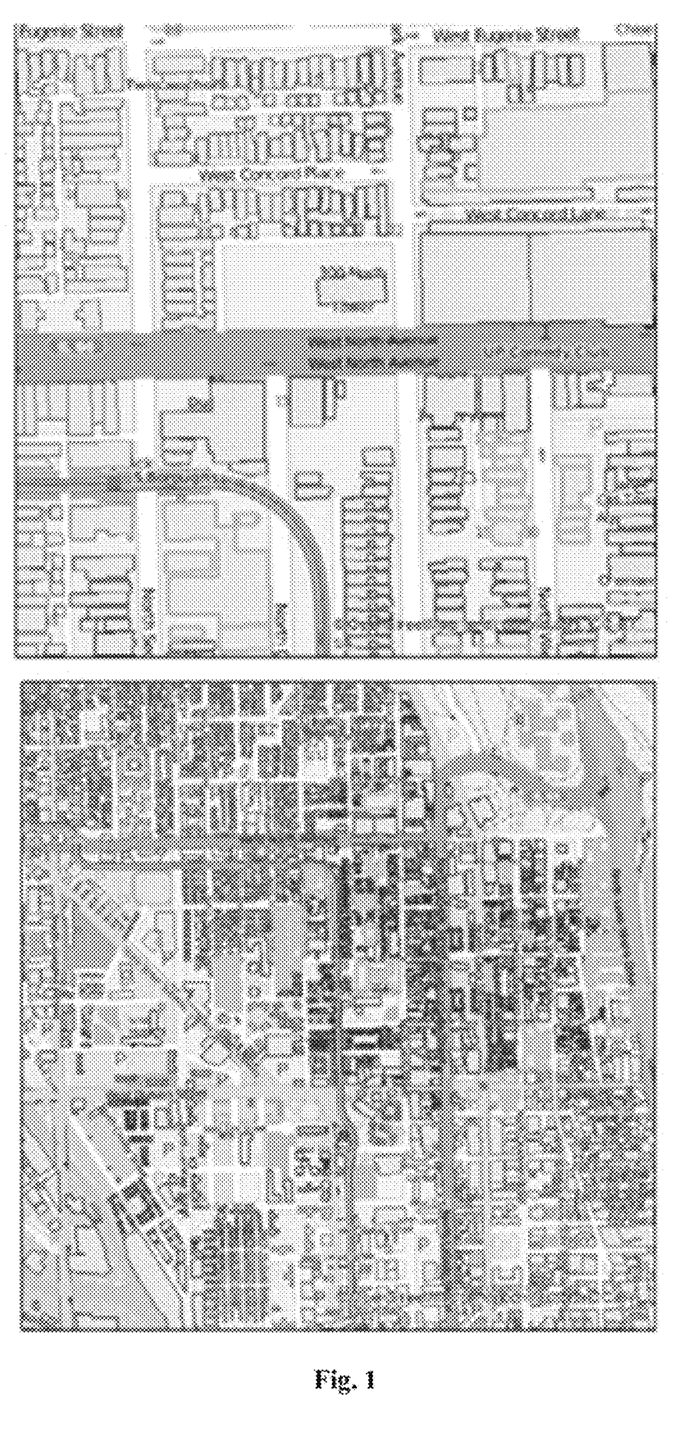
FIG. 1 shows exemplary USAS output maps showing system status information as building polygons, according to embodiments of this invention.

In embodiments of this invention, the system and method uses standardized information exchanges at the building level. The invention uses geospatial elements such as polygon features to provide real-time updates on critical infrastructure service and restoration status during a disaster. FIG. 1 shows example output maps from a USAS system that represents the restoration status of natural gas or electric service at the building level. Each polygon outlines a building footprint with coding to represent restoration status. The coding can incorporate any suitable coding, such as a color coding. In some embodiments of this invention, the coding is binary, merely indicating whether the service is on or off at each building polygon.

A more complex coding, such as with more than one color, or colors mixed with symbols and/or patterns (e.g., crosshatching stripes within the polygon), can be used to indicate further levels of information, for example, multiple utilities, priority, urgency, and/or length of outage. The use of a color coded symbol on each building would allow every responding organization to know which utility has been restored to the building as there are dependencies between utility types. For example, there is no value to having any responder for communications go to a building until electricity is restored. Knowing this information improves decision making and the ability to better prioritize limited resources resulting in improved resiliency.

In embodiments of this invention, the building level map can include and display, via color coding, symbols, and/or text, a name or type of use of some or each building, such as labeling or representing polygons as residential, senior living center, hospital, emergency response location (fire, police, ambulance, red cross centers use for temporary housing), utility operations center, etc. Having this information displayed allows the responding organizations to prioritize their actions based on which buildings are critical to reinforce or update prior to an event and restore following an event (improving the resiliency).

The use of building level geospatial polygons to share information addresses two primary reasons for limited information exchange before, during, and after disasters between critical infrastructure operators and other organizations. First, exchanging building level information instead of system level information eliminates security concerns when sharing proprietary information. Second, defined data exchange mechanisms reduce or eliminate the data incompatibility issues that arise from the use of proprietary systems and data formats. Utility company outage management systems typically contain a wealth of information that would provide useful information to other stakeholders. However, the output of outage management systems is often in a proprietary format that does not allow exchange or sharing. USAS can deliver data independent of the content and format of a company's outage management system.

Figure 2:
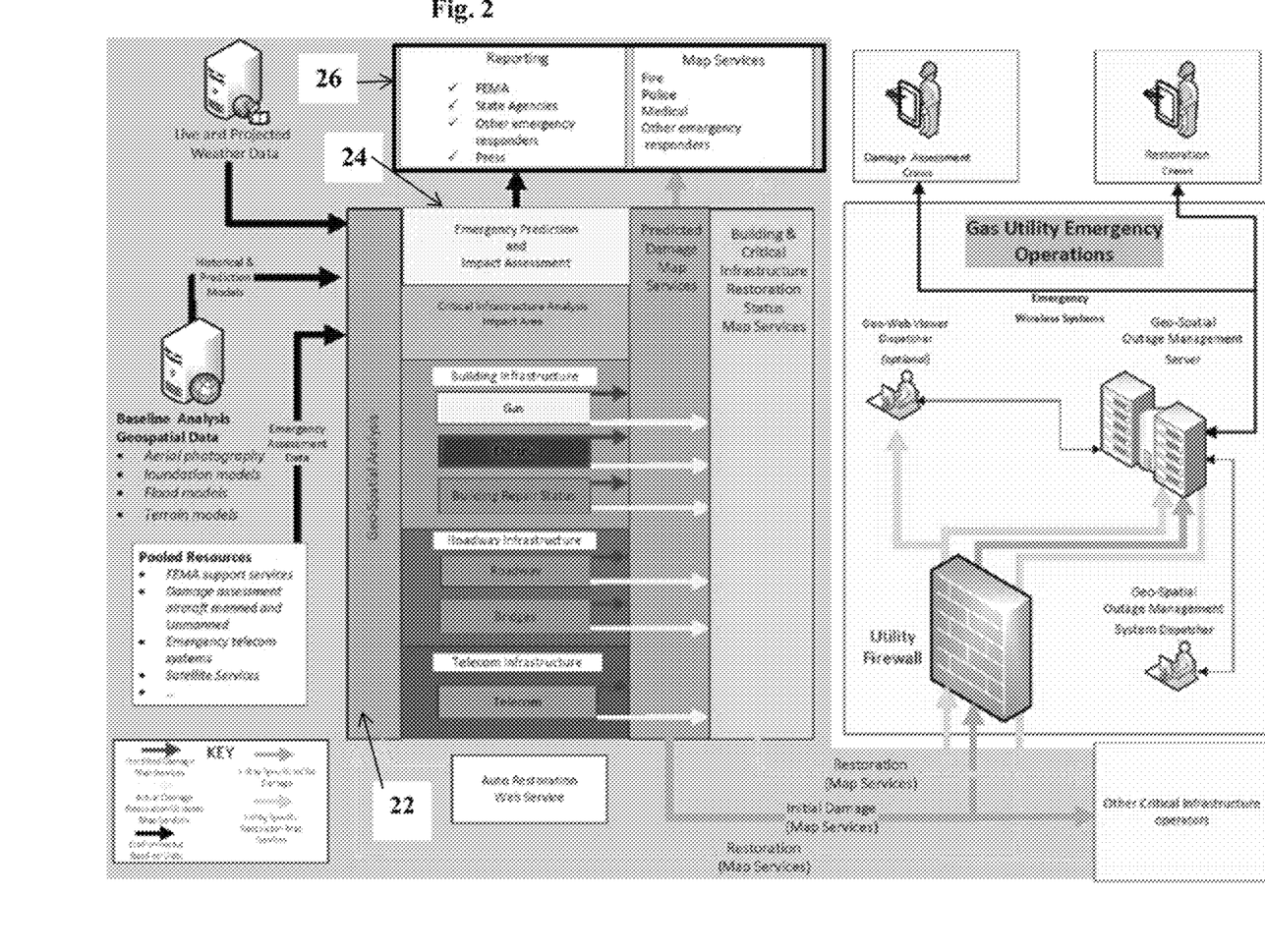
FIG. 2 illustrates a system and method according to one embodiment of this invention.

FIG. 2 shows an architecture of the USAS according to one embodiment of the invention. In FIG. 2, the USAS has three primary modules to recognize the interdependency of critical infrastructure and to provide situational awareness, decision support, and information sharing before, during, and after disasters. A first module 22 is a situational awareness component that predicts, defines, and characterizes damage to a utility infrastructure resulting from a disaster, including impacted customers and cascading impacts with other critical infrastructure systems. Information from external sources, such as weather feeds, aerial surveillance data, social media, and sensors, can be received into this module to provide near real-time environmental situational awareness.

This situational awareness module 22 can define the size and scale of the disaster and its resultant impact on the utility infrastructure. This information will assist utility companies in preparing for disasters including the staging of resources, potential reconfiguration to increase resiliency and public safety, public outage notifications, and activation of requests for assistance. This module 22 can also provide information to make decisions regarding the deployment of aerial surveillance, emergency telecommunication resources, and computing centers. This module 22 can quantify the extent of the damage and the resultant impact on the customers including microgrid and distributed generation users. The system can provide both predictions before a disaster and real-time assessments during and after a disaster.

The second module is a decision support component 24 that assists infrastructure operators in planning and deploying restoration resources. Coordination of restoration activities after a disaster is difficult and chaotic, primarily because of the lack of effective communication and the inability to handle the large volumes of data created after a disaster. One of the root causes of ineffective communication during system restoration is security concerns that prohibit utility companies from sharing system level information. The method and system of this invention addresses this issue by dissemination of restoration status information at the building level in a manner that is separated from the operational and system structure of a utility company's energy delivery system. The specific technique employed for the exchange of restoration status information is the geospatial polygon feature used to define the perimeter of a building.

USAS can also use the building polygon approach, without limitation, for defining the status of wireless communication, vehicle access, and building conditions using publically available data. As information is received about the condition and status of the environment surrounding a building polygon, the system can update and change the polygon status as needed. Information from sensors, smart metering technology, and other forms of telemetry can also be incorporated as a source of data. USAS can further support decision making by prioritizing buildings for service restoration based on the critical nature of the end-users (hospitals, microgrid operators, shelters, etc.).

The system can also contain a road condition analysis module within or in concert with the module 24 for determining and displaying roadway conditions on the building level display. A road centerline model provides an understanding of roadway conditions that might prohibit restoration activities. Crowd source and social media applications can also be used to provide data on roadway conditions and accessibility. It can be critical to know if you can 'get there from here' as each emergency responder plans their response. By knowing the status of each building, its use as described above, coupled with the ability to know access status (whether the roadway is open or closed) for each responder greatly improves the efficiency of the response.

The third module 26 is an information sharing component that serves as a communication mechanism, providing service and restoration status information to, emergency responders, government agencies, and other organizations with an interest in the status of service. The decision support component 24 receives status updates and provides real-time updates to the standardized building level display, and the information sharing component 26 automatically transmits the real-time updates to remote computers and/or mobile devices. The module 26 can manage inward bound status input and outward bound communications to other organizations. The information can be disseminated through map displays, online graphics, and reports, etc. at various levels of details based on the entity receiving the information. The information can be based on an analysis of a selected impact area with status information derived from building level information. This module 26 can provide maps and reports to communicate temporal snap shots recording the progress of restoration. The third module 26 can also use the building polygon approach for sharing information to protect security and proprietary information.

The USAS system and method of this invention overcomes traditional barriers to information sharing by using a novel approach that exchanges information at the customer point-of-service using building level information exchange instead of requiring the exchange of network or system level data. This approach, used in combination with advanced geospatial processing technologies and data exchange methodologies, will enable natural gas utility companies and other critical infrastructure operators to exchange data for situational awareness. This will avoid the security and proprietary risks typically associated with network level information sharing.

Interoperability limitations and proprietary data formats also limit the usefulness of direct data exchange between critical infrastructure operator's traditional outage systems and government agencies. The outage management systems in use at electric and gas utility companies vary greatly and automated information sharing at this level is not feasible. Current techniques for sharing data involve manual exchanges based on specific requests. The USAS overcomes interoperability issues by using pre-defined data exchange methodologies for specific content, format, frequency, and conditions for change notification.

Many commercial platforms are available to collect and combine data from disparate source during disasters. However, these technologies are limited to digitizing field collected data using feature synchronization processes that are not supported in a transactional environment. Information is received using batch processing techniques. These technologies do not support the type of real-time data transaction required for situational awareness and streamlined information sharing.

The system of this invention can include or work in concert with a utility component stored and executed by a processor on an outage management system (or equivalent) of each of the participating utility providers. The utility components have coded instructions to automatically extract and provide pre-defined status data from the outage management system in a standardized format. In a preferred embodiment of this invention, the system includes an application program interface (API), or suitable alternative, for an outage management system of each of the utility providers to allow extraction of the status data from the outage management system in a standardized format to be used by the modules 22 and/or 24. The API includes a set of routines, protocols, and/or tools to allow the utility to build a software application on their own proprietary system that can interact, communicate and provide the standardized information to allow the integration with the building level map.

The USAS provides enhanced capabilities for creating situational awareness and deliver decision support capabilities by overcoming the limitations of existing technologies. The USAS functions at the geospatial feature level, thereby easily managing large scale concurrency when reporting changes. The nature of disasters requires frequent and granular updates in near real-time and USAS will provide this functionality through feature level updates. This level of granularity will allow emergency responders to maintain a current and detailed level of understanding of service and restoration status. The USAS can further reduce the time required to exchange information between utility companies and other organizations and will also improve the quality and reliability of exchanged information.

Figure 3:
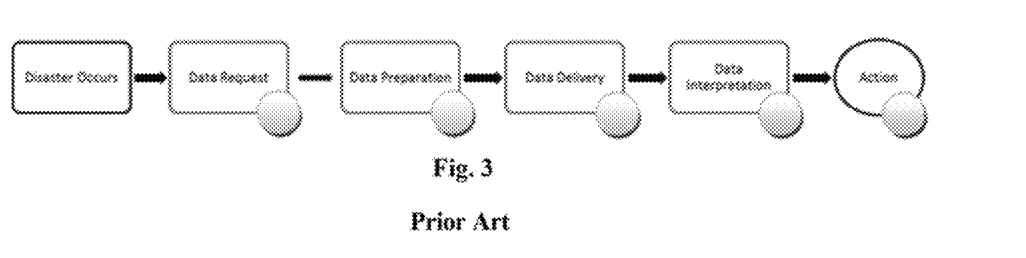
FIG. 3 summarizes a conventional process for exchanging status information immediately after a disaster occurs.

FIG. 3 presents the current process for exchanging status information immediately after a disaster occurs with the following pivot points: 1) Requested on an ad-hoc basis; 2) Manually extracted and prepared in an unspecified format; 3) Delivered, usually in a proprietary format or through paper maps and spreadsheets; 4) Manually interpreted; 5) Used for situational awareness and decision making. Each data exchange event is unique and the time required to complete the transaction depends on various situational factors, but SMEs estimate data exchanges during natural disasters typically require five hours and can take as long as 48 hours. It is common for emergency responders to make decisions before the requested information is received based on situational needs, resulting in sub-optimal decisions. Data is typically extracted and presented using manual methods and is therefore subject to transmission error. The frequency and consequence of inaccurate data is difficult to quantify. However, it is understood that inaccurate information about the service and restoration status of critical utilities during a disaster could increase outage times and put property and human life at greater risk.

Figure 4:
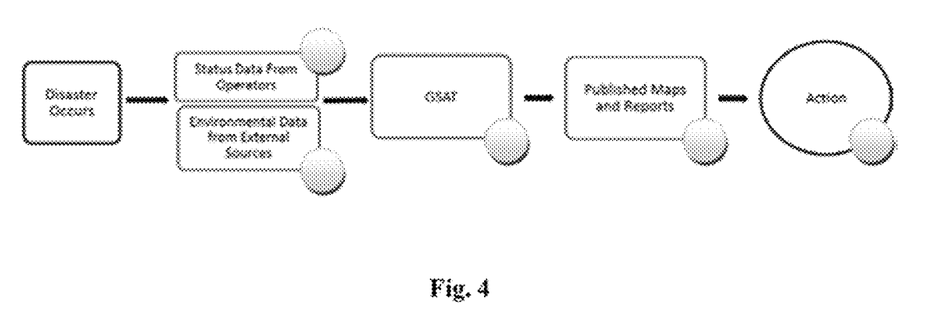
FIG. 4 illustrates a data exchange workflow according to one embodiment of this invention.

FIG. 4 illustrates a data exchange workflow provided with the method and system of this invention, with the following impact points: 1) Pre-defined status data is automatically extracted from critical infrastructure operator's outage management system in a standardized format; 2) Pre-defined environmental data from external sources is automatically extracted; 3) Status and environmental data is automatically combined and published by USAS; 4) Infrastructure operators and emergency responders receive maps and reports automatically from USAS; 5) Accurate and timely data is available to support real-time decision making. The time required to exchange information is reduced from several hours to several minutes. The time required to extract, collate, and publish information can be reduced to as low as 5-10 minutes. Further, the automated extraction and transfer of information in pre-defined formats can significantly decrease the opportunity for inaccurate information being used in decision making. SMEs estimate the access to actionable data in near-real time could reduce the frequency or impact of an outage by up to 10%.

The method and system of this invention provides a shift for incident management in how it differs from the other systems available today. The fully developed system can provide one or more of: live geospatial representation of an incident available for response; incident prediction information, meteorological, geological preconfigured for rapid use; incident definition, geospatial data delivered to utilities for analytical support in outage management systems (flood impact, wind, storm surge, ice, seismic influence, fire . . . ); sharable restoration status of network delivered services during an incident; maps displaying restoration and processes support for utilities that do not have GIS; data supplied to system through selective and general crowd sourced information; status exchange methodology that protects the security of the network service providers distribution infrastructure configuration and location; interactive status update display of all service providers including planned activities; platforms to buildout the interactive cascade analysis of service providers; and the ability to display results of incident geospatial analytical processes directly in web-based information management systems, such as WebEOC.

Thus the method and system of this invention provides a tool to assist with decision making for utility restoration during outages and disasters. The system changes the way information is gathered prior to, during, and/or following a disaster through real-time use of mobile platforms and crowdsourced data, and can significantly increase the capability to share complex information. Exemplary impact by this invention includes: increased situational awareness related to threat identification, preparation, and restoration; high-quality and reliable data for effective decision making; automated processes that significantly reduce the risk of errors; and quick information exchange to meet time-critical demands.

It will be appreciated that details of the foregoing embodiments, given for purposes of illustration, are not to be construed as limiting the scope of this invention. Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention, which is defined in the following claims and all equivalents thereto. Further, it is recognized that many embodiments may be conceived that do not achieve all of the advantages of some embodiments, particularly of the preferred embodiments, yet the absence of a particular advantage shall not be construed to necessarily mean that such an embodiment is outside the scope of the present invention.

We claim:

1. A method of providing situational awareness of utility infrastructures operated by more than one utility provider, the method comprising:
   automatically obtaining supply information from each of the more than one utility provider and geographic information, wherein the more than one utility provider comprises at least two different utility service types;
   automatically obtaining further supply and/or geographic information from social media;
   automatically standardizing the geographic information and supply information at a building level;
   automatically combining the information into a standardized building level display including a plurality of individual building representations; and
   automatically providing to a processing device of at least one remote outage responding entity updates on infrastructure and restoration status from the more than one utility provider through and on the building level display, wherein the building level display indicates a current utility delivery status for the more than one utility provider at each of the plurality of individual building representations.

2. The method of claim 1, wherein the standardized building level display comprises a building level map without displaying system level information of any of the more than one utility provider.

3. The method of claim 1, wherein the standardized building level display represents buildings supplied by the more than one utility provider as geospatial polygons, and the infrastructure and restoration status comprises a color coding for each of the more than one utility provider and for each geospatial polygon to indicate current utility delivery status at a corresponding building.

4. The method of claim 1, wherein the standardizing comprises automatically extracting and integrating non-confidential information, without system level information of any of the more than one utility provider, from each of different proprietary formats between outage management systems of the more than one utility provider.

5. The method of claim 1, wherein the geographic information comprises weather data and/or geospatial data, and the standardizing comprises combining the geographic information with the supply information to construct a building level map.

6. The method of claim 1, wherein automatically obtaining supply information comprises automatically extracting pre-defined status data from an outage management system of the each of the more than one utility provider in a standardized format.

7. The method of claim 1, wherein automatically standardizing the supply information at the building level comprises creating a binary representation of supply status on the building level display.

8. The method of claim 1, further comprising providing an application program interface to each of the more than one utility provider for extracting pre-defined status data from an outage management system.

9. The method of claim 1, wherein automatically combining the information comprises collating data from the each of the more than one utility provider and the geographic information.

10. The method of claim 9, further comprising analyzing geospatial data with live or projected weather data to predict utility outages and/or causes on the building level display.

11. The method of claim 1, wherein the more than one utility provider comprises a combination of two utility providers selected from a group consisting of: an electric utility provider, a gas utility provider, and a telecommunication provider.

12. The method of claim 1, further comprising automatically determining and displaying roadway conditions and accessibility on the building level display.

13. A system for providing situational awareness of utility infrastructures operated by more than one utility provider, wherein the more than one utility provider includes at least two different utility service types, the system comprising at least one data processor in executable combination with one or more memory devices, the one or more memory devices including coded instructions for implementing:

a decision support component that automatically obtains utility supply information from each of the more than one utility provider and geographic information, automatically standardizes the utility supply information at a building level, automatically obtains further supply and/or geographic information from social media, and automatically combines the geographic information and supply information into a standardized building level display; and an information sharing component that automatically provides to at least one remote outage responding entity updates on infrastructure and restoration status from the more than one utility provider on the building level display.

14. The system of claim 13, further comprising coded instructions for implementing a situational awareness module that imports geographic data from external sources and predicts and/or characterizes disaster damage.

15. The system of claim 13, wherein the decision support component receives status updates and provides real-time updates to the standardized building level display, and the information sharing component transmits the real-time updates.

16. The system of claim 13, wherein the standardized building level display comprises a building level map representing each building supplied by the more than one utility provider as a geospatial polygon with a color coding indicating current utility delivery status for each of the more than one utility provider.

17. The system of claim 13, wherein the standardizing comprises automatically extracting and integrating non-confidential information from each of different proprietary formats between outage management systems of the more than one utility provider.

18. The system of claim 13, further comprising a utility component stored and executed by a processor on an outage management system of each of the more than one utility provider having coded instructions to automatically extract pre-defined status data from the outage management system in a standardized format.

19. The system of claim 13, further comprising a road condition analysis module for determining and displaying roadway conditions on the building level display.

* * * * *